(12) United States Patent
Johnson et al.

(10) Patent No.: US 9,703,330 B2
(45) Date of Patent: Jul. 11, 2017

(54) PROTECTIVE CASE FOR ARTICULATING ELECTRONIC DEVICE

(71) Applicant: Otter Products, LLC, Fort Collins, CO (US)

(72) Inventors: Jamie L. Johnson, Fort Collins, CO (US); Stephen Willes, Salt Lake City, UT (US); W. Travis Smith, Fort Collins, CO (US); Jonathan Watt, Colorado Springs, CO (US)

(73) Assignee: Otter Products, LLC, Fort Collins, CO (US)

( * ) Notice: Subject to any disclaimer, the term of this patent is extended or adjusted under 35 U.S.C. 154(b) by 33 days.

(21) Appl. No.: 14/671,701

(22) Filed: Mar. 27, 2015

(65) Prior Publication Data

US 2015/0205332 A1 Jul. 23, 2015

Related U.S. Application Data

(63) Continuation of application No. 13/050,791, filed on Mar. 17, 2011, now Pat. No. 9,025,317.

(Continued)

(51) Int. Cl.
*G06F 1/18* (2006.01)
*H05K 5/02* (2006.01)
(Continued)

(52) U.S. Cl.
CPC .............. *G06F 1/181* (2013.01); *A45C 11/00* (2013.01); *H04M 1/0252* (2013.01);
(Continued)

(58) Field of Classification Search
CPC .............. G06F 1/1628; A45C 2011/002; A45C 2011/003; A45C 11/00
See application file for complete search history.

(56) References Cited

U.S. PATENT DOCUMENTS 6,109,434 A * 8/2000 Howard, Jr. .......... G06F 1/1601
206/320
7,933,122 B2 * 4/2011 Richardson ............. H04M 1/18
206/320

(Continued)

FOREIGN PATENT DOCUMENTS

WO 9400037 A1 1/1994
WO 9941958 A1 8/1999

*Primary Examiner* — Zachary M Pape
*Assistant Examiner* — Douglas Burtner

(57) ABSTRACT

A protective cover for a portable computing device includes a first hardshell component, a second hardshell component, and a hinging element. The first hardshell component removably snaps onto a first portion of the portable computing device to protect the first portion of the portable computing device. The second hardshell component removably snaps onto a second portion of the portable computing device to protect the second portion of the portable computing device. The hinging element comprises a flexible material and is attached to the first hardshell component and the second hardshell component such that the hinging element of the protective cover aligns with the hinging structure of the portable computing device. The hinging element flexes to allow the second portion of the portable computing device to remain articulable relative to the first portion of the portable computing device when the protective cover is installed on the portable computing device.

19 Claims, 13 Drawing Sheets

Related U.S. Application Data

(60) Provisional application No. 61/317,537, filed on Mar. 25, 2010, provisional application No. 61/314,954, filed on Mar. 17, 2010.

(51) Int. Cl.
*H04M 1/02* (2006.01)
*H04M 1/18* (2006.01)
*A45C 11/00* (2006.01)

(52) U.S. Cl.
CPC .......... *H04M 1/185* (2013.01); *H05K 5/0217* (2013.01); *A45C 2011/002* (2013.01); *A45C 2011/003* (2013.01)

(56) References Cited

U.S. PATENT DOCUMENTS

| | | | |
|---|---|---|---|
| 2002/0065054 A1 | 5/2002 | Humphreys et al. | |
| 2003/0095374 A1 | 5/2003 | Richardson | |
| 2003/0114184 A1* | 6/2003 | Wilson | H04M 1/0216 455/550.1 |
| 2004/0180706 A1* | 9/2004 | Pan | H04M 1/0283 455/575.3 |
| 2004/0256535 A1* | 12/2004 | Desch | A47B 23/042 248/460 |
| 2004/0262179 A1* | 12/2004 | Gartrell | A45C 11/00 206/320 |
| 2005/0139498 A1 | 6/2005 | Goros | |
| 2006/0175370 A1* | 8/2006 | Arney | A45F 5/021 224/666 |
| 2006/0177048 A1* | 8/2006 | Tsutaichi | H01R 13/5213 379/433.13 |
| 2007/0205122 A1* | 9/2007 | Oda | H04M 1/0283 206/320 |
| 2008/0032758 A1* | 2/2008 | Rostami | A45C 11/00 455/575.8 |
| 2008/0053851 A1* | 3/2008 | Ko | A45C 11/00 206/320 |
| 2008/0083631 A1* | 4/2008 | Tsang | A45C 11/18 206/320 |
| 2008/0121321 A1* | 5/2008 | Tiner | A45C 1/06 150/131 |
| 2008/0125197 A1* | 5/2008 | Hongo | H04M 1/0216 455/575.3 |
| 2009/0009945 A1* | 1/2009 | Johnson | G06F 1/1613 361/679.27 |
| 2009/0032421 A1* | 2/2009 | Sween | A45C 3/02 206/320 |
| 2009/0034169 A1 | 2/2009 | Richardson et al. | |
| 2009/0194445 A1* | 8/2009 | Mongan | A45C 13/021 206/320 |
| 2010/0096284 A1 | 4/2010 | Bau | |
| 2011/0157800 A1 | 6/2011 | Richardson et al. | |
| 2012/0154288 A1* | 6/2012 | Walker | G06F 1/1616 345/169 |

* cited by examiner

PROTECTIVE CASE FOR ARTICULATING ELECTRONIC DEVICE

CROSS REFERENCE TO RELATED APPLICATIONS

This application is a continuation of U.S. patent application Ser. No. 13/050,791, filed on Mar. 17, 2011, which claims priority to U.S. Provisional Patent Application 61/317,537, filed on Mar. 25, 2010, and to U.S. Provisional Patent Application 61/314,954, filed on Mar. 17, 2010, all of which are hereby incorporated by reference in their entireties.

BACKGROUND

Protective covers for handheld electronic devices, such as various types of MP3 players, video players, cell phones, smart phones, satellite phones, walkie talkies, GPS navigational devices, telematics devices, pagers, monitors, personal data assistants, bar code scanners, as well as various types of computers, including portable computers, laptop computers, handheld computers, ultra-mobile computers, tablet computers, and various hybrid devices that combine two or more of these functions, provide a valuable function in preventing damage to these handheld electronic devices. Various types of protective cases are available that provide a varying amount of protection.

SUMMARY

A protective cover for a portable computing device includes a first hardshell component, a second hardshell component, and a hinging element. The portable computing device has at least a first portion and a second portion where the second portion is connected to the first portion through a hinging structure such that the second portion articulates relative to the first portion. The first hardshell component of the protective cover removably snaps onto the first portion of the portable computing device to protect at least one surface of the first portion of the portable computing device. The second hardshell component removably snaps onto the second portion of the portable computing device to protect at least one surface of the second portion of the portable computing device. The hinging element comprises a flexible material and is attached to the first hardshell component and the second hardshell component such that the hinging element of the protective cover aligns with the hinging structure of the portable computing device. The hinging element of the protective cover flexes to allow the second portion of the portable computing device to remain articulable relative to the first portion of the portable computing device when the protective cover is installed on the portable computing device.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DESCRIPTION

Many electronic devices are constructed with two pieces that may be joined by hinges or various sliding mechanisms. Examples of such devices may be hand held mobile telephones, portable gaming devices, laptop computer, netbook computers, or other devices.

A protective cover or outer shell for these devices may be constructed with two hard shell components, one for the front portion of the electronic device and one for the rear portion. A silicone or other flexible component may be held by one or both of the hard shell components.

In some embodiments, the flexible component may be held by only one of the hard shell components. In an example of such an embodiment, the flexible component may be installed underneath the rear hard shell component.

In some embodiments, the flexible component may be held or retained by both hard shell components. In an example of such an embodiment, the flexible component may be retained by both hard shell components and the flexible component may have a portion that covers a hinge or other mechanism that may join the two portions of the electronic device.

The flexible component may have pads or other mechanisms that may allow a user to active a button on the electronic device when the cover is installed. Some embodiments may have removable covers for earphone ports or other electrical connectors as well.

In some embodiments, the protective cover may be a removable cover that may be installed and removed by a consumer. In such embodiments, the protective cover may have logos, colors, or other designs that allow a user to personalize their electronic device. In such embodiments, the protective cover may have snaps or other engagement mechanisms that may be easily installed and removed by a consumer.

In other embodiments, the protective cover may not be a consumer installed cover. In such embodiments, the protective cover may be installed by the manufacturer of the electronic device and may be an integral part of the electronic device. In such embodiments, the protective cover may be installed using fasteners, adhesives, snaps, or other mechanisms for which a typical consumer may not have access or ability to install or remove.

Figure 1:
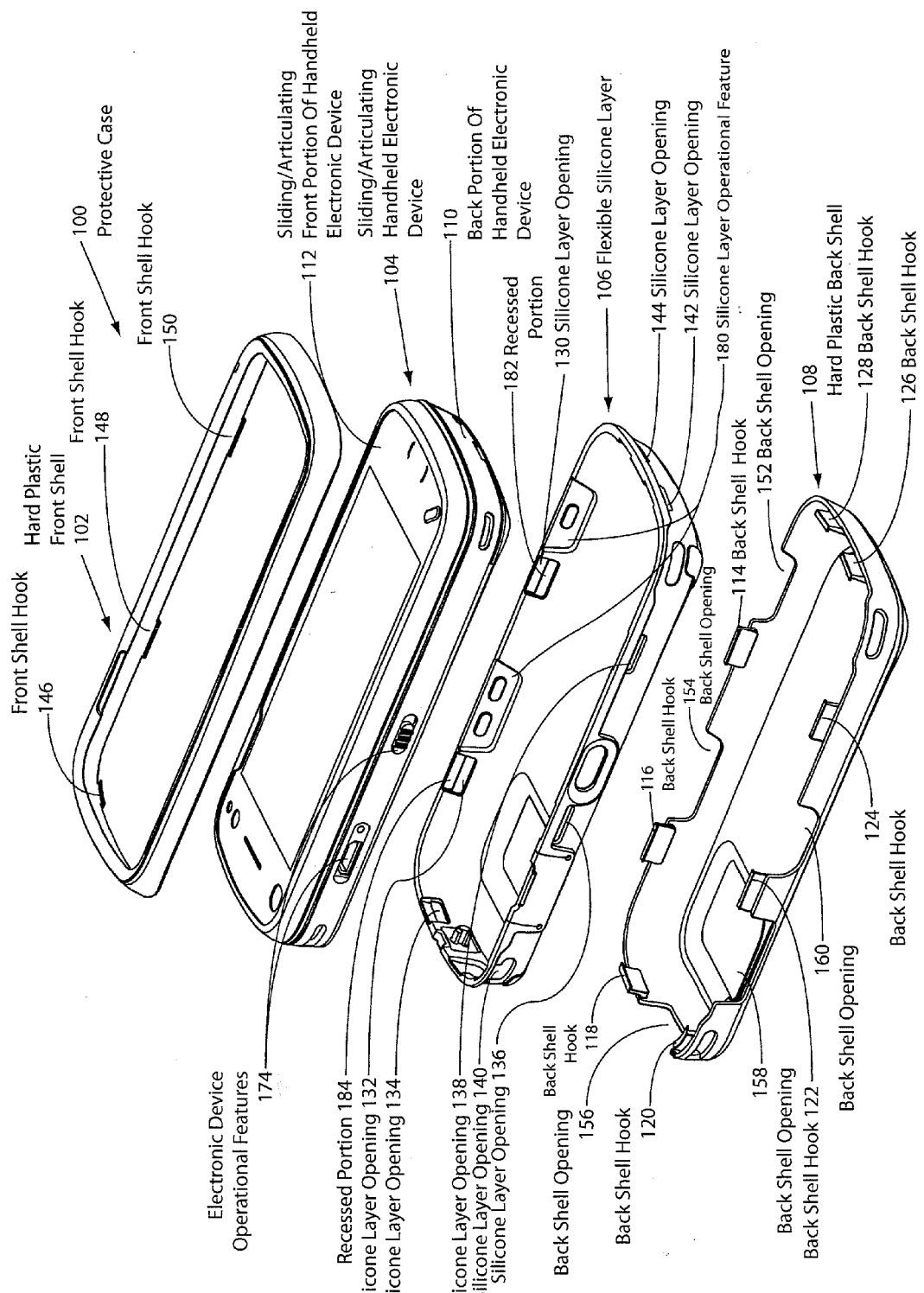
FIG. 1 is an exploded view of an embodiment of a protective case and a sliding/articulating handheld electronic device.

FIG. 1 is a perspective view of a protective case 100 and a sliding/articulating handheld electronic device 104. Many handheld electronic devices have a back portion 110 and a front sliding/articulating front portion 112. Mobile phones, for example, may have a sliding front portion that may include a screen that slides to an open position to access a keyboard. Other mobile phones may have a front portion, such as sliding/articulating front portion 112, that articulates on hinges to expose a keyboard.

In order to provide a cover for both the back portion 110 and the sliding/articulating front portion 112, separate hard plastic shells, such as hard plastic front shell 102 and hard plastic back shell 108, can be utilized. However, plastic shells that attach directly to front and back portions of handheld electronic devices often do not provide a large amount of protection, especially against shocks from impacts. In addition, hard plastic shells may provide openings to operational features of the handheld electronic device that further reduces the protection provided by hard plastic shells.

As illustrated in FIG. 1, the hard plastic front shell 102 has a series of hooks, such as front shell hooks 146, 148, 150, and other front shell hooks (not shown), on opposing sides of the hard plastic front shell 102, that attach the hard plastic front shell 102 to the sliding/articulating front portion 112 of the sliding/articulating handheld electronic device 104.

The hard plastic front shell 102 may be constructed from thermoplastic polymers and has a hardness generally in the range of 65 to 120 on the Rockwell scale for HDPE, acrylic, PP, PVC, ABS, nylon, 10% GF PC. A narrower range of 105-115 on the Rockwell scale can be used for ABS and PC. These ranges are exemplary only and may vary with specific materials. The thermoplastic polymers can be molded, die cast or otherwise formed to a desired shape. Other materials can also be used for the hard shell, including metals that can be formed or machined to a desired shape.

The hard plastic front shell 102 may attach directly to the sliding/articulating front portion 112 of the sliding/articulating handheld electronic device 104. The hard plastic front shell may allow the sliding/articulating front portion 112 to slide or articulate between an open and closed position without interfering with the sliding/articulating motion provided by a sliding/articulating connector (not shown). The hard plastic front shell 102 may provide impact protection and may have an elevated surface that may protect the sliding/articulating front portion of the sliding/articulating handheld electronic device 104 from impacts.

As also illustrated in FIG. 1, a hard plastic back shell 108 has a plurality of back shell hooks 114, 116, 118, 120, 122, 124, 126, 128 that attach the hard plastic back shell 108 to the back portion 110 of the sliding/articulating handheld electronic device 104. Again, the manner in which the back shell hooks 114-128 attach to the back portion 110 of the sliding/articulating handheld electronic device 104 may not impede the operation of the sliding/articulating front portion 112 of the sliding/articulating handheld electronic device 104.

The hard plastic back shell 108 also has a plurality of back shell openings 152, 154, 156, 158, 160 that are aligned with electronic device operational features 174, including buttons and ports, in the sliding/articulating handheld electronic device 104. The electronic device operational features 174 include the operational features illustrated in FIG. 1, as well as the device buttons 186, 188, illustrated in FIG. 4, and other operational features that may exist on the sliding/articulating handheld electronic device 104. The hard plastic back shell 108 can be made from the same materials as the hard plastic front shell 102 with the same range of hardness.

As also illustrated in FIG. 1, a flexible silicone layer 106 is provided that is disposed in the hard plastic back shell 108. The density of the flexible silicone layer ranges from 50 Shore A to 60 Shore A, but may vary from 30 to 70 Shore A. In one embodiment, a range of 48-52 Shore A is used.

The flexible silicone layer 106 is molded to fit directly into, and to conform closely to, the hard plastic back shell 108. The flexible silicone layer 106 has a plurality of silicone layer openings 130, 132, 134, 136, 138, 140, 142, 144. Each of these silicone layer openings 130-144 is aligned with back shell hooks 114-128, respectively.

Each of the back shell hooks 114-128 is recessed inwardly from the outer edge of the hard plastic back shell 108 so as to engage the silicone layer openings 130-144. The back shell hooks 114-128 are inserted through the silicone layer openings 130-144 from the outside of the flexible silicone layer 106 and extend inwardly to the interior portion of the flexible silicone layer 106. In this fashion, the back shell hooks 114-128 are disposed inside of the flexible silicone layer 106, adjacent recessed portions, such as recessed portions 182, 184 in flexible silicone layer 106, which allows the back shell hooks 114-128 to engage the back portion 110 of the sliding/articulating handheld electronic device 104.

By inserting the recessed back shell hooks 114-128 through silicone layer openings 130-144, the back shell hooks 114-128 are hidden by the flexible silicone layer 106 and a clean and decorative appearance is provided from the outside of the hard plastic back shell 108. Also, since the back shell hooks 114-128 are recessed inwardly and the flexible silicone layer 106 is recessed outwardly, next to silicone layer openings 130-144, such as recessed portions 182, 184, there is little or no deflection of the flexible silicone layer 106 resulting from insertion of the back shell hooks, which further assists the combination of the hard plastic back shell 108 and the flexible silicone layer 106, to function as a single integrated unit.

Upon assembly, the hard plastic back shell 108 and the flexible silicone layer 106 may be securely married together as a result of the mechanical connection between the recessed back shell hooks 114-128 and the silicone layer openings 130-144, since the back shell hooks 114-128 are inserted through silicone layer openings 130-144. In this manner, the flexible silicone layer 106 appears to be part of the hard plastic back shell 108 and functions as a single integrated unit. As a result, the flexible silicone layer 106 can be made from a soft, flexible material that is more easily capable of absorbing shocks since deformation and movement of the flexible silicone layer 106 away from the hard plastic back shell 108 is substantially restricted.

The back shell openings 152-160 are aligned with various portions of the flexible silicone layer 106, as disclosed in more detail below. As also shown in FIG. 1, silicone layer operational features 180 are disposed in the flexible silicone layer 106 that are disposed in the back shell openings 152-160 when the flexible silicone layer 106 is married to the hard plastic back shell 108. The silicone layer operational features 180 generically refer to the various pads, portals, access panels and other operational features of the flexible silicone layer 106.

Figure 2:
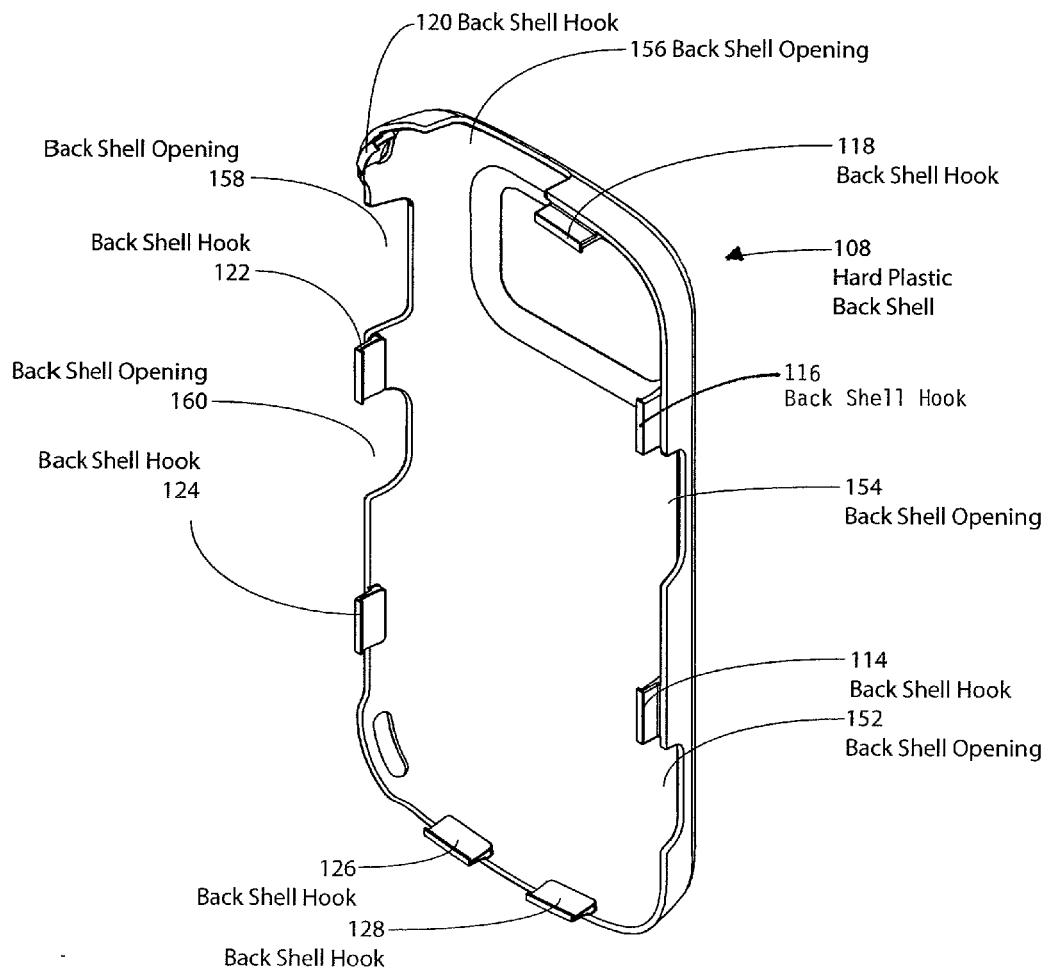
FIG. 2 is a perspective view of a hard plastic back shell of the embodiment of FIG. 1.

FIG. 2 is a schematic perspective view of the hard plastic back shell 108. As illustrated in FIG. 2, the hard plastic back shell 108 includes a plurality of back shell hooks 114-128 that are recessed from the outer surface of the hard plastic back shell 108. The back shell hooks 114-128 slide through the silicone layer openings 130-144 of flexible silicone layer 106 (FIG. 1) and are hidden by the flexible silicone layer 106. The silicone layer operational features 180 are disposed in the back shell openings 152-160, as disclosed in more detail below, to prevent the entry of dust, dirt and moisture.

Figure 3:
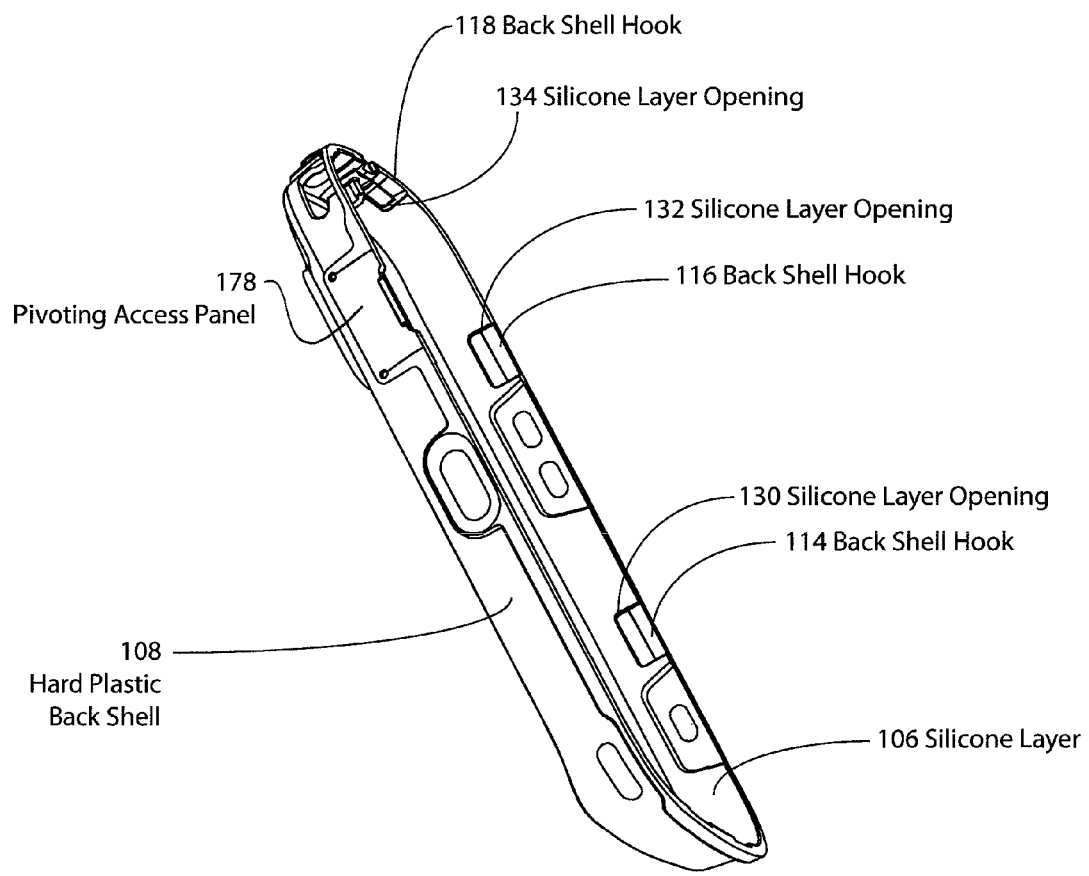
FIG. 3 is a perspective view of an assembled silicone layer and hard plastic back shell.

FIG. 3 is a schematic perspective view of the flexible silicone layer 106 disposed in the hard plastic back shell 108. As shown in FIG. 3, back shell hooks 114, 116, 118 are inserted through silicone layer openings 130, 132, 134 in the flexible silicone layer 106. Back shell hooks 114, 116, 118 are disposed on the interior portion of the flexible silicone layer 106 for attachment to the back portion 110 (FIG. 1) of the sliding/articulating handheld electronic device 104 (FIG. 1). Since the back shell hooks 114-118 are inserted through the silicone layer openings 130-134, back shell hooks 114-118 are not visible from the exterior of the hard plastic back shell 108.

For example, as illustrated in FIG. 3, back shell hooks 120, 122, 124, 126, 128 (FIGS. 1 and 2) are not visible since the flexible silicone layer 106 hides the back shell hooks 120-128, as illustrated in FIG. 3. In this manner, the flexible silicone layer 106 and hard plastic back shell 108 appear as a single integrated unit. Further, back shell hooks 114-128, when inserted through silicone layer openings 130-144, function to securely hold the flexible silicone layer 106 to the hard plastic back shell 108 so that the combined structure functions as a single integrated unit. FIG. 3 also includes a pivoting access panel 178, which provides access to a port on the back portion 110.

Figure 4:
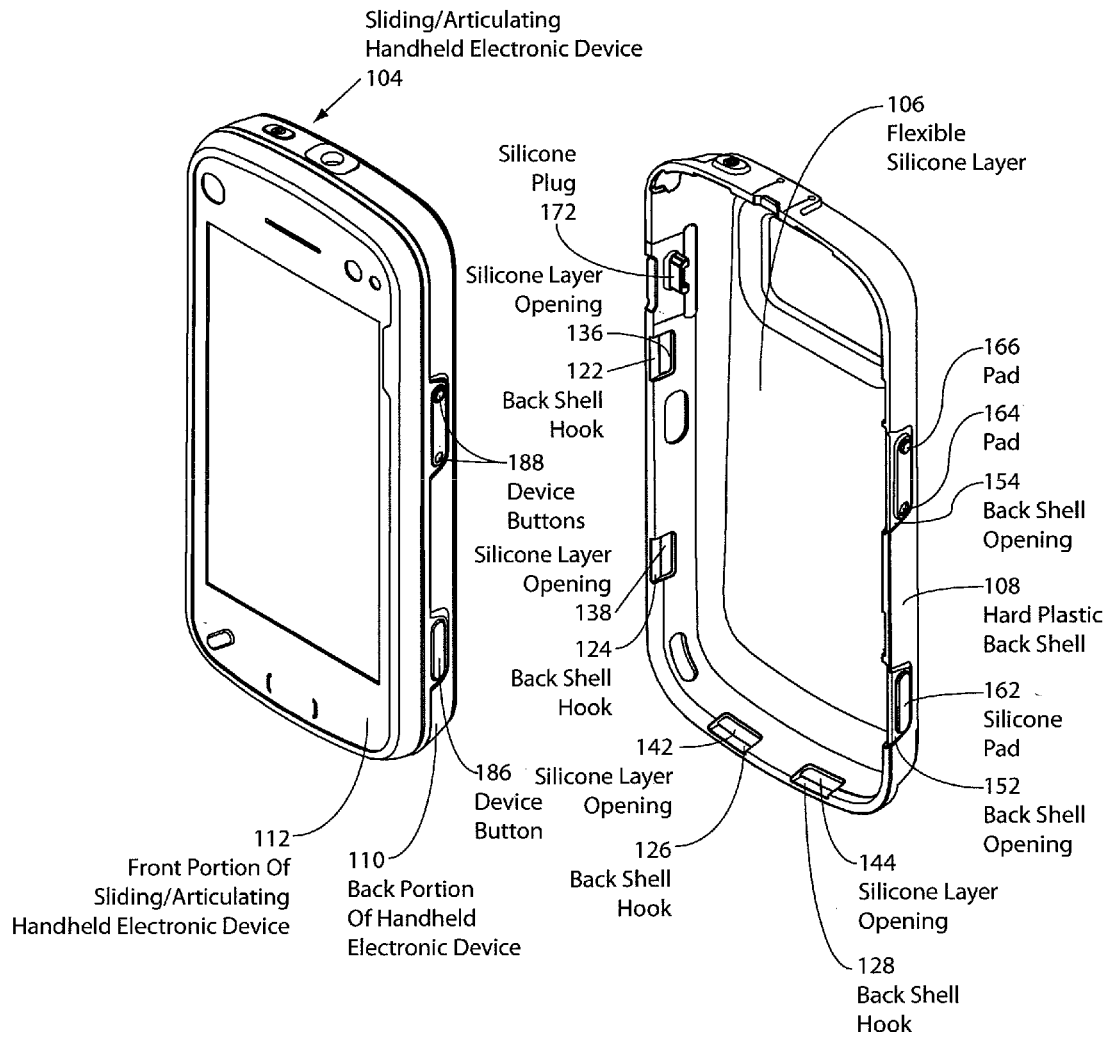
FIG. 4 is another perspective view of the assembled hard plastic back shell and silicone layer of the embodiment of FIG. 1, and the sliding/articulating handheld electronic device.

FIG. 4 is an exploded view of the sliding/articulating handheld electronic device 104 that is aligned with the flexible silicone layer 106, which is married to the hard plastic back shell 108. As shown in FIG. 4, silicone pad 162 is disposed in back shell opening 152. Similarly, silicone pads 164, 166 are disposed in the back shell opening 154. Silicone pads 162, 164, 166 comprise silicone layer operational features 180 (FIG. 1), as well as other operational features on the flexible silicone layer 106, such as device buttons 186, 188 that are disclosed in FIG. 1.

The silicone layer operational features 180 interact with electronic device operational features 174. Specifically, silicone pad 162 interacts with the device button 186, while silicone pads 164, 166 interact with device button 188. Another silicone layer operational feature 180 comprises the silicone plug 172 that is inserted in a jack (not shown) in the back portion 110 of the sliding/articulating handheld electronic device 104.

As also illustrated in FIG. 4, the back shell hook 122 extends through the silicone layer opening 136. Similarly, back shell hook 124 is inserted through the silicone layer opening 138. Back shell hook 126 is similarly inserted through silicone layer opening 142, while back shell hook 128 is inserted through silicone layer opening 144. Each of the back shell hooks 114-128 (FIGS. 1 and 4) attach to an inner surface of the back portion 110 of the sliding/articulating handheld electronic device 104 to securely hold the assembled flexible silicone layer 106 and hard plastic back shell 108 to the back portion 110 of the sliding/articulating handheld electronic device 104 without interfering with the sliding motion of the sliding/articulating front portion 112 (FIGS. 1 and 4) of the sliding/articulating handheld electronic device 104.

Figure 5:
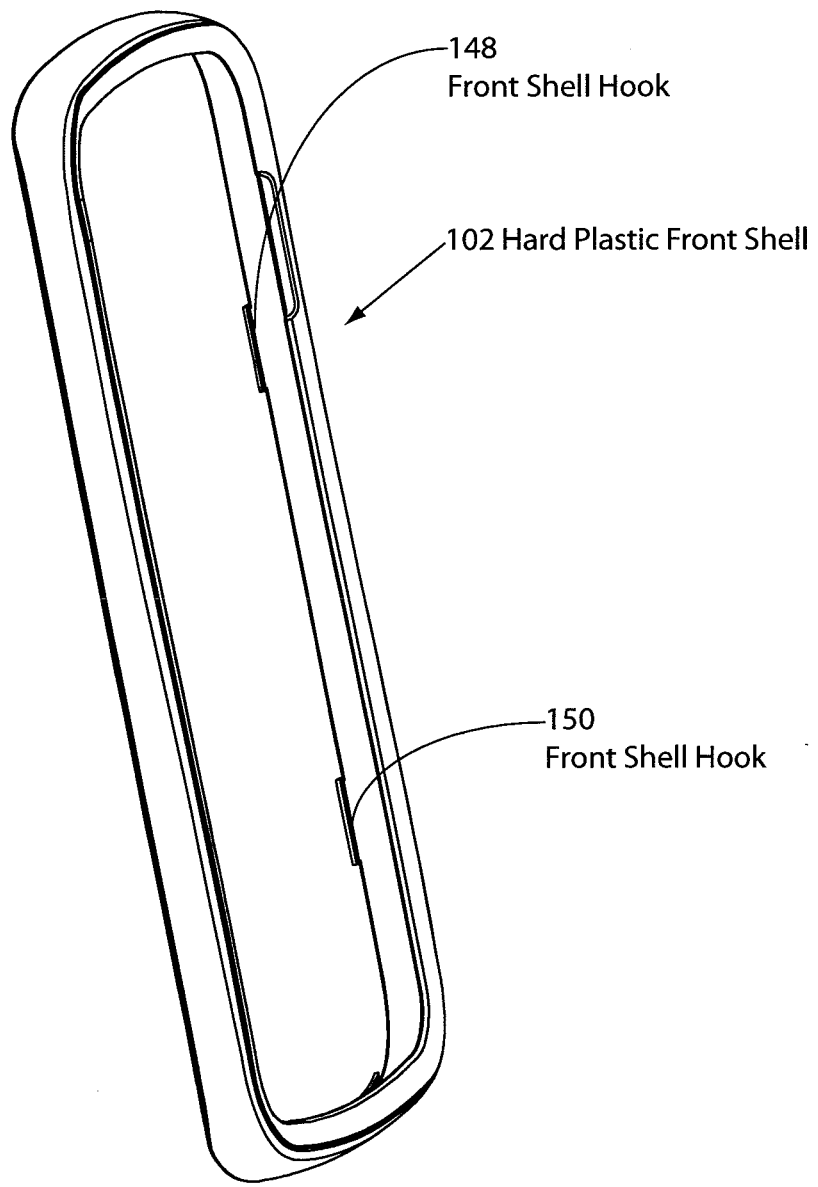
FIG. 5 is a perspective view of the hard plastic front shell of the embodiment of FIG. 1.

FIG. 5 is a schematic perspective view of the hard plastic front shell 102. As shown in FIG. 5, front shell hooks 148, 150, as well as other front shell hooks not illustrated in FIG. 5, securely attach to the sliding/articulating front portion 112 of the sliding/articulating handheld electronic device 104. The hard plastic front shell 102, as well as the front shell hooks, do not interfere with the sliding/articulating motion of the sliding/articulating front portion 112 of the sliding/articulating handheld electronic device 104.

Figure 6:
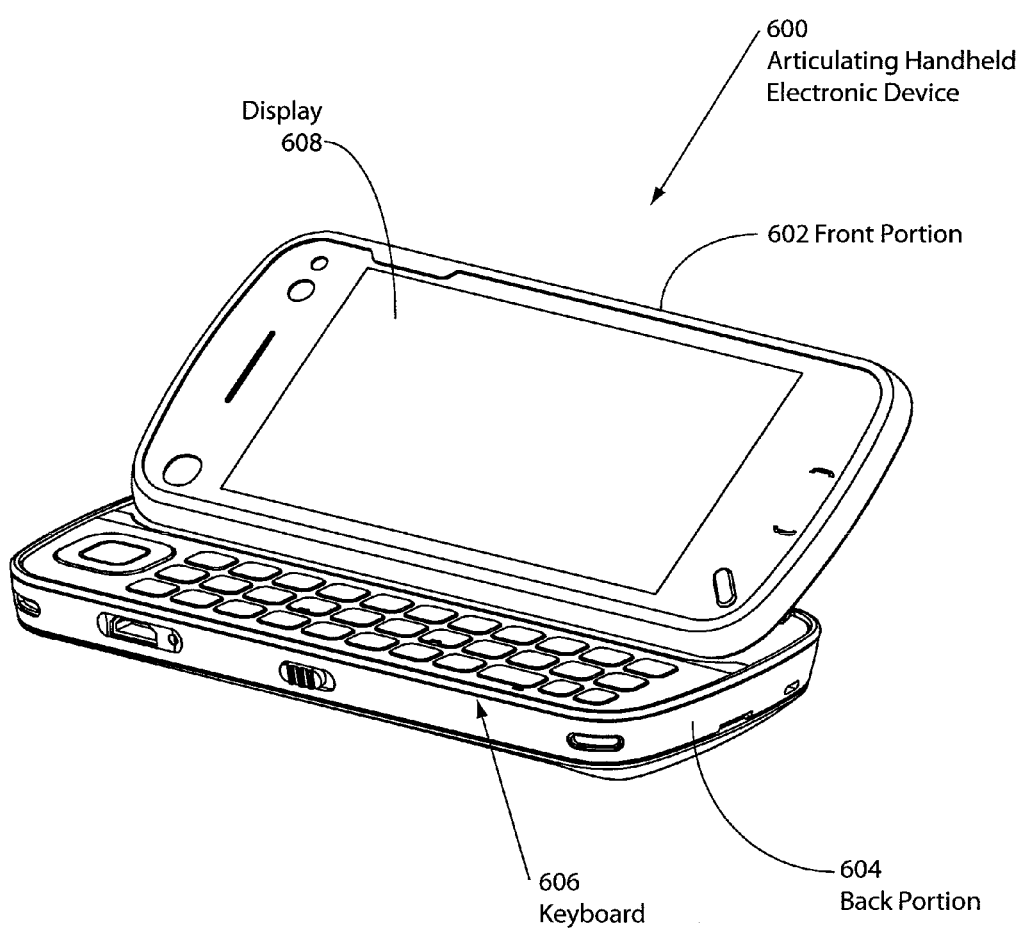
FIG. 6 is a perspective view of an embodiment of an articulating handheld electronic device.

FIG. 6 is a schematic perspective view of an articulating handheld electronic device 600. As shown in FIG. 6, the front portion 602 swivels away from the back portion 604 to expose a keyboard 606. The front portion, as illustrated in the embodiment of FIG. 6, includes a display 608 that is disposed at an angle to the back portion 604 and keyboard 606 to assist in viewing the information on display 608. The protective cover 100 (FIG. 1) is attached to the front portion 602 and back portion 604 in a manner that does not impede the articulating movement of the front portion 602.

Figure 7:
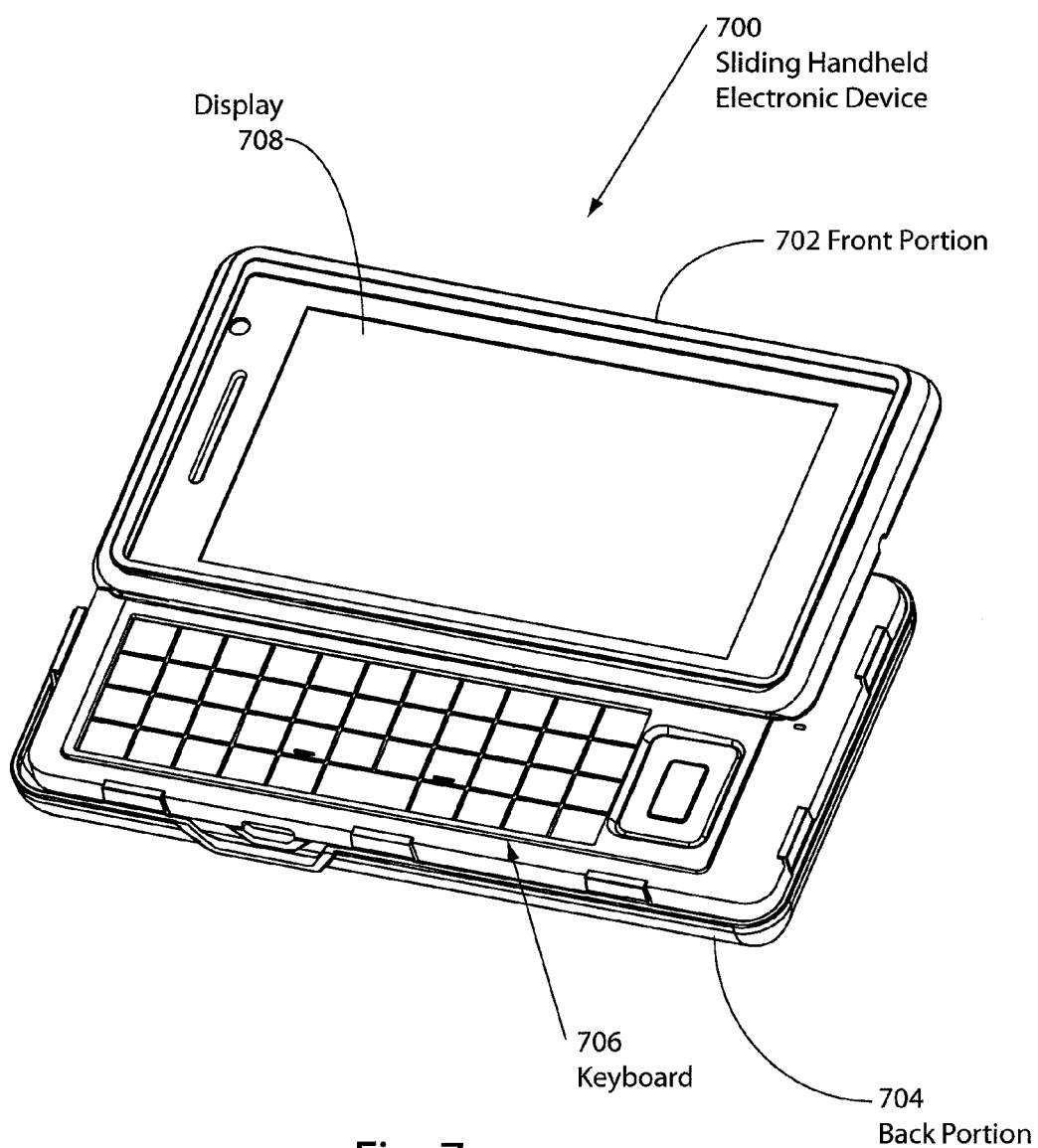
FIG. 7 is a perspective view of an embodiment of a sliding handheld electronic device.

FIG. 7 is a schematic perspective view of a sliding handheld electronic device 700. As shown in FIG. 7, a front portion 702 slides away from a back portion 704 to expose the keyboard 706. A hard plastic front shell, such as hard plastic front shell 102 (FIG. 1), attaches to the front portion 702 and does not interfere with the movement of the front portion 702 with regard to the back portion 704. Similarly, a hard plastic back shell and flexible silicone layer, such as hard plastic back shell 108 (FIG. 1) and flexible silicone layer 106 (FIG. 1), attach to the back portion 704 and do not interfere with the articulating movement of the front portion 702 of the sliding handheld electronic device 700.

Figure 8:
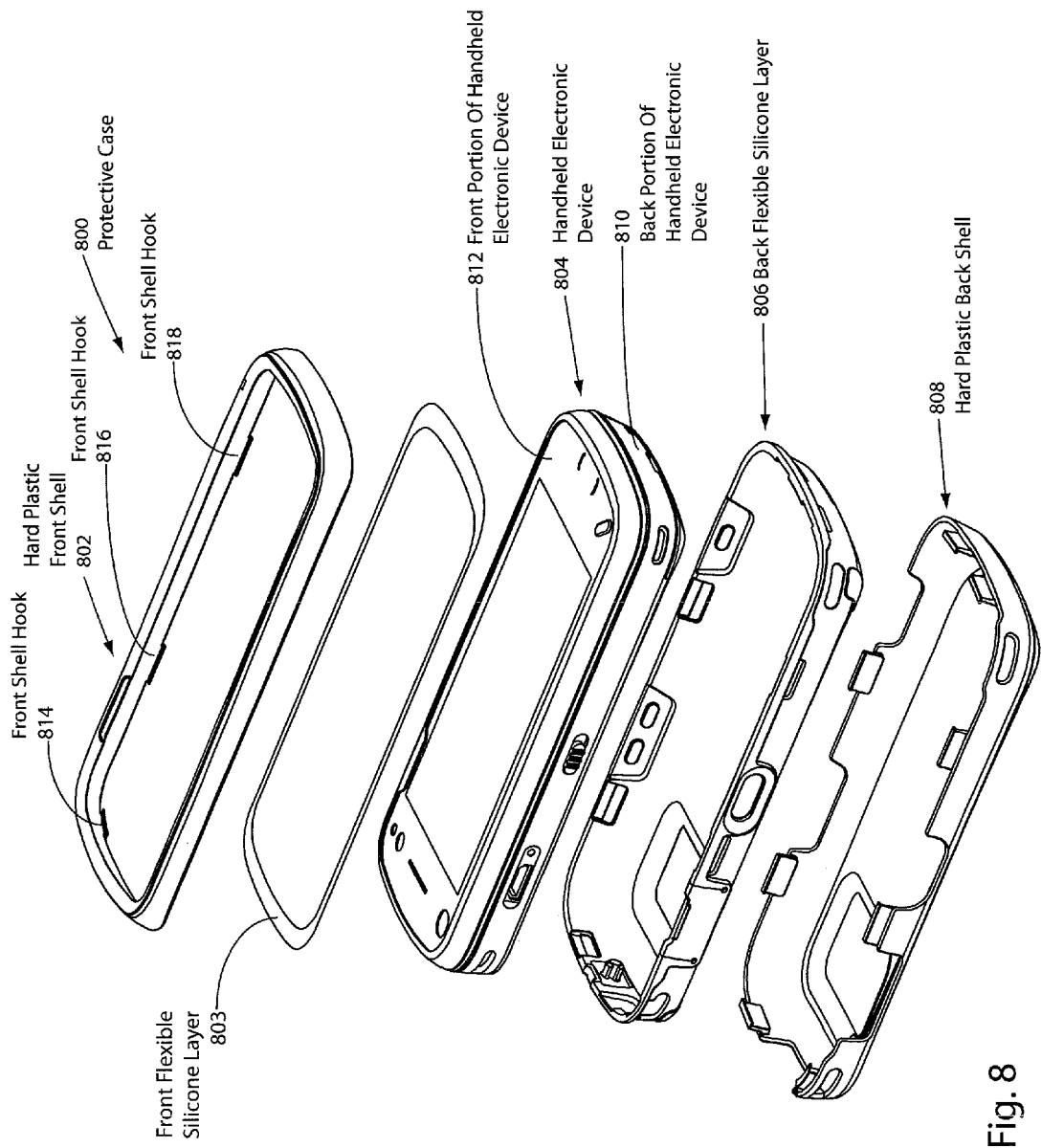
FIG. 8 is an exploded view of another embodiment of a protective case for a sliding/articulating handheld device.

FIG. 8 is an exploded view of another embodiment of a protective case 800 and a sliding/articulating handheld device 804. As illustrated in FIG. 8, a front flexible silicone layer 803 is disposed in hard plastic front shell 802. The combined structure is then attached to the front portion 812 of the handheld electronic device 804 with front shell hooks 814, 816, 818. The back flexible silicone layer 806 is disposed in the hard plastic back shell 808 and attaches to the back portion 810 of the handheld electronic device 804, in the same manner as disclosed with respect to FIG. 1.

The protective case 800 provides additional protection to the front portion 812 of the handheld electronic device 804 as a result of the use of the combined structure of the hard plastic front shell 802 and front flexible silicone layer 803. Hence, a flexible silicone layer is disposed under both the front plastic hard shell 802 and the hard plastic back shell 808 to provide additional protection to both the front portion 812 and the back portion 810 of the handheld electronic device 804.

Figure 9:
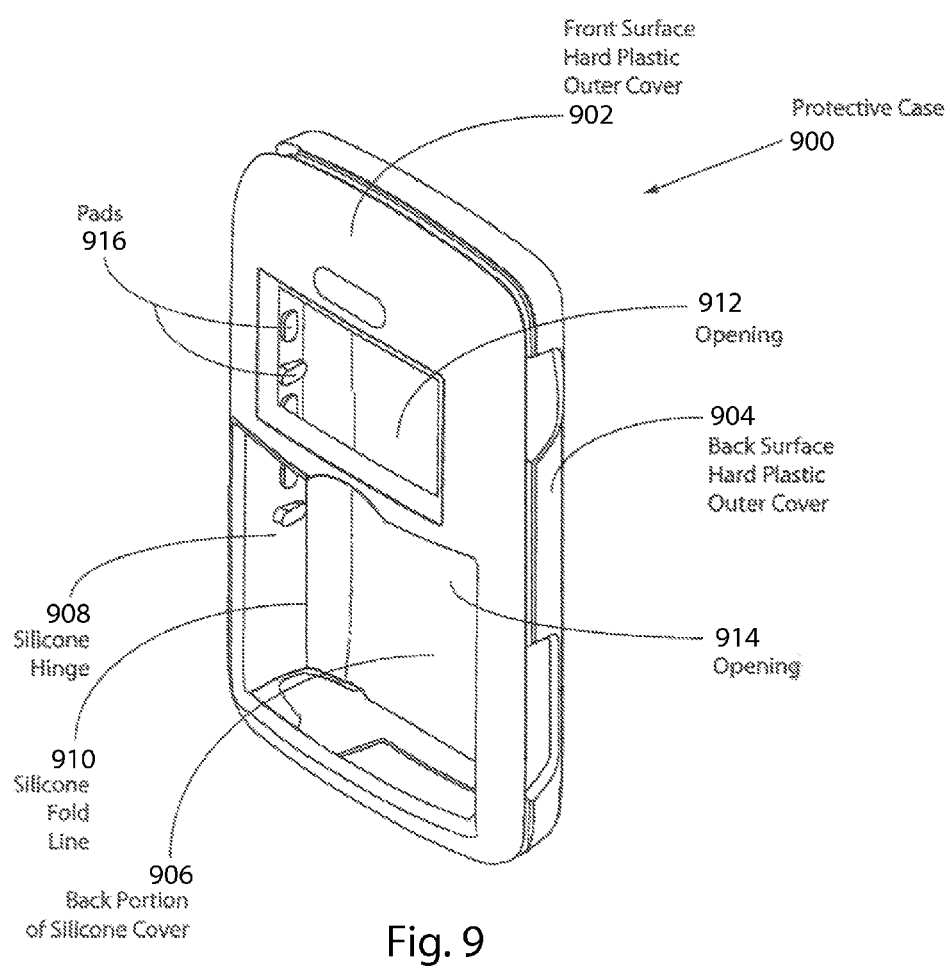
FIG. 9 is a schematic isometric view of an embodiment of a protective case that includes an integrated silicone hinge.

FIG. 9 is a schematic perspective view of an embodiment of a protective case 900 that may be used for a device with a hinge and where the flexible component of the protective case may cover or span the hinge area of the device.

As shown in FIG. 9, the protective cover 900 includes a front surface hard plastic outer cover 902 that snaps onto the front face of a handheld electronic device, such as a mobile phone. Similarly, a back surface hard plastic outer cover 904 snaps onto the back surface of the mobile phone, or other electronic device.

A silicone cover 922, that is soft and flexible, has a front portion 920 that is disposed in the interior portion of the front surface hard plastic outer cover 902 and a back portion 906 that is disposed in back surface hard plastic outer cover 904. A silicone hinge 908, that connects front and back portions of the silicone layer, is disposed between the front surface hard plastic cover 902 and the back surface hard plastic outer cover 904, and hinges along silicone fold line 910.

Figure 10:
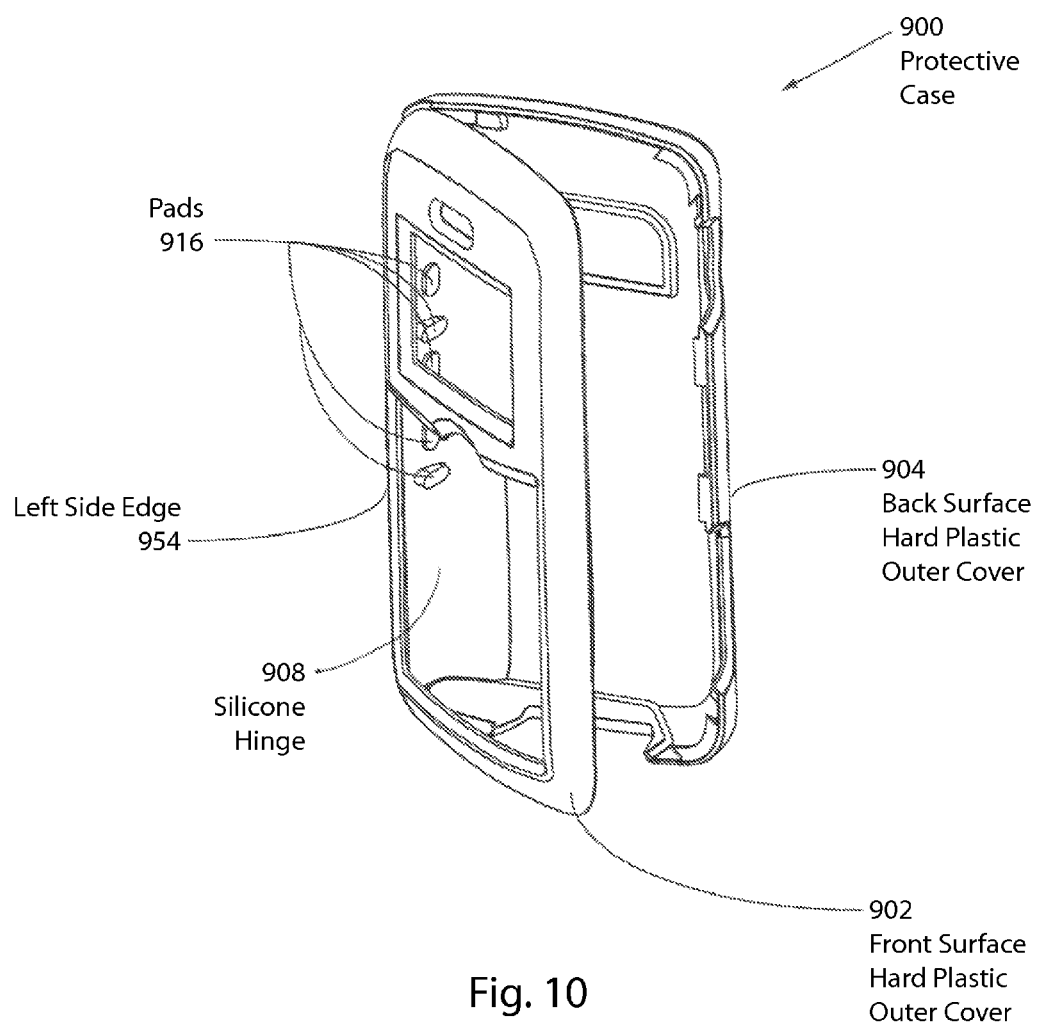
FIG. 10 is a schematic isometric view of an embodiment of a handheld electronic device.

FIG. 10 illustrates an example embodiment 900 that shows a protective cover in a partially open position. The protective cover may come in three parts: a front hard plastic cover 902, a back hard plastic cover 904, and a silicone hinge 908.

In some embodiments, the silicone hinge 908 may be a separate, removable piece that is installed first, then the front cover 902 and back cover 904 may be installed on top of the silicone hinge 908.

In other embodiments, the silicone hinge 908 may be molded to one or both of the front cover 902 and back cover 904. In such an embodiment, the silicone hinge 908 may be overmolded onto the back cover 904 and/or the front cover 902. Some embodiments may use a two-shot molding technique or a separate molding operation to mold the silicone hinge 908 onto one or both of the covers.

As shown in FIG. 10, the embodiment 900, has a hinge 952 that hinges along the left vertical side 954 of handheld electronic device 950. The embodiment 900 may be a protective cover for a cellular telephone or other handheld mobile device. Openings 912, 914, illustrated in FIG. 9, allow a user to view activity and enter information into the electronic device. As also shown in FIG. 9, the silicone hinge 908 may include pads 916 that assist the user in entering information into the side of the handheld electronic device. The silicone hinge 908 provides protection to the left side edge 954 of the handheld electronic device and allows information to be entered into the handheld electronic device through pads 916 on the left side edge 954 of the handheld electronic device, while the protective case 900 and the handheld electronic device are in a closed position.

In other words, the silicone hinge 908 allows access to buttons 958 (FIG. 10) on the side 954 of the handheld electronic device when the handheld electronic device and the protective case 900 are in a closed position, and the silicone hinge 908 provides protection to the side of the handheld electronic device adjacent to the silicone hinge 908. Additionally, the front surface hard plastic outer cover 902 and the back surface hard plastic outer cover 904 provide additional protection from impacts and help disperse impacts throughout the softer silicone layer 922 that is disposed under the hard plastic covers 902, 904.

Figure 11:
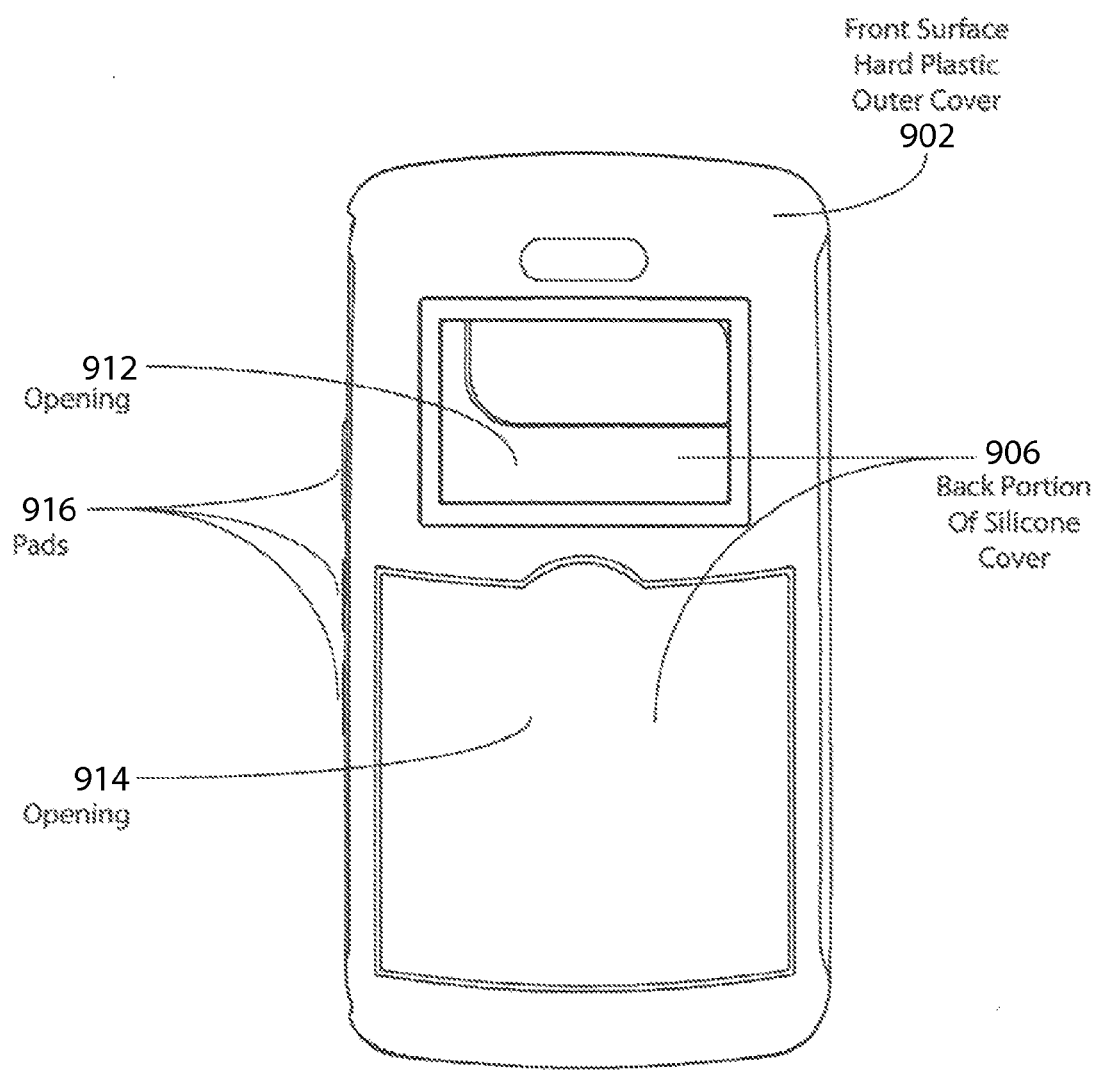
FIG. 11 is a front view of the embodiment of FIG. 9.

FIG. 11 is a front view of the embodiment of FIG. 9. As shown in FIG. 11, the front surface hard plastic outer cover 902 has openings 912, 914. The back portion 906 of the silicone inner cover 922 can be viewed through the openings 912, 914. In addition, pads 916 are shown as part of the silicone hinge 908 that interface with buttons 958 on the handheld electronic device that is disposed in the protective case 900.

Figure 12:
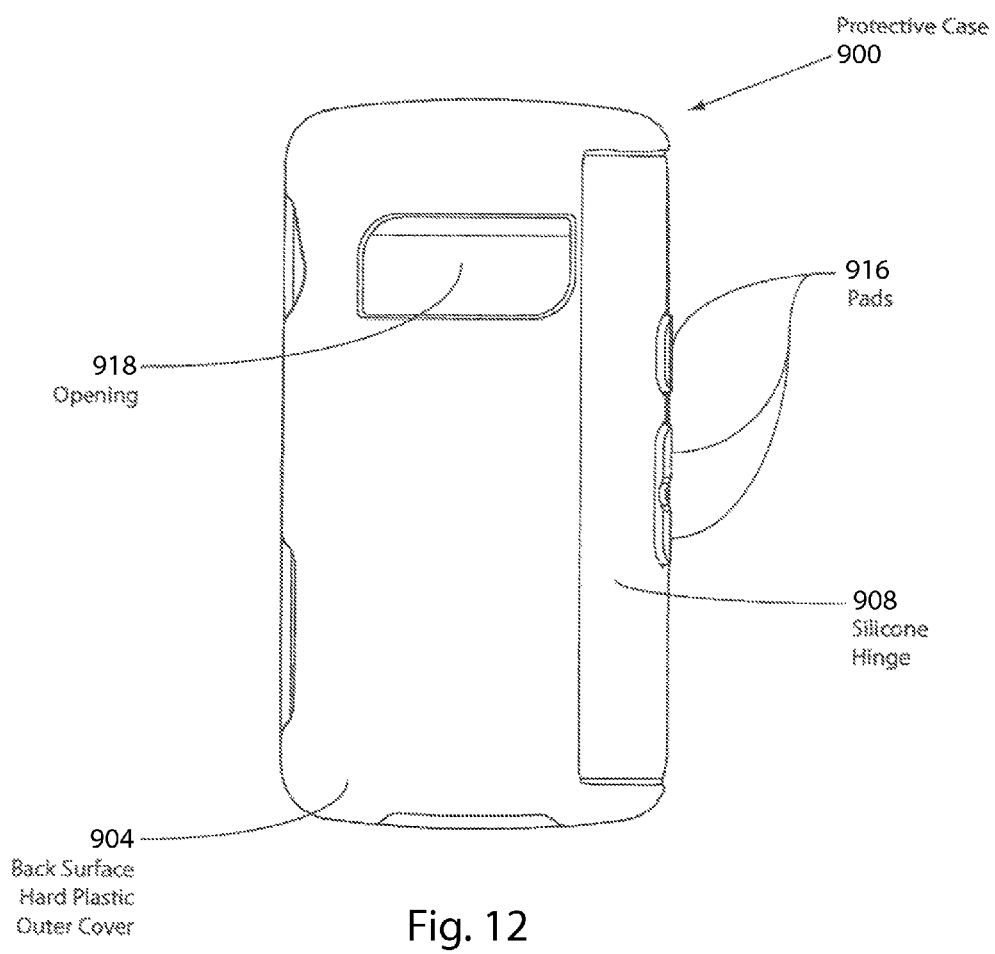
FIG. 12 is a back view of the embodiment of FIG. 9.

FIG. 12 is a back view of the protective case 900. As shown in FIG. 12, the back surface hard plastic outer cover 904 has an opening 918. The front portion 920 of the silicone inner cover 922 that is disposed in an inner portion of the front surface hard plastic outer cover 902 is visible through the opening 918. As also illustrated in FIG. 3, the back surface hard plastic outer layer 904 covers only a portion of the back surface, so that silicone hinge 908 is partially exposed. In this manner, silicone hinge 908 has a broad area to flex when the protective case 900 is in the open position.

Pads 916 allow activation of buttons 958 on the enclosed handheld electronic device while the protective case 900 is in the closed position. In this manner, the entire side of the enclosed electronic device is protected by the silicone hinge 908, while the pads 916 allow access to the enclosed handheld electronic device.

Figure 13:
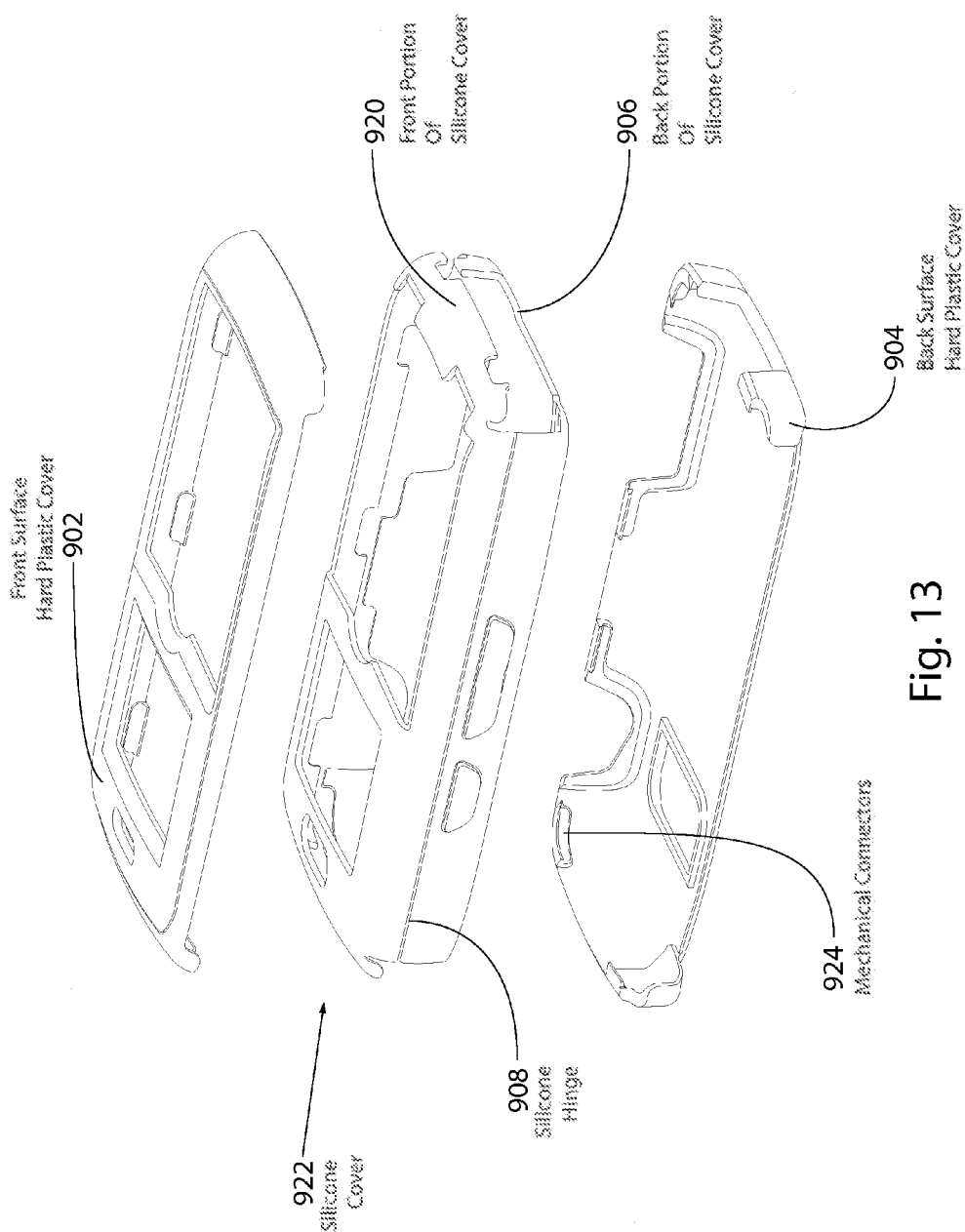
FIG. 13 is an exploded view of the three pieces of the embodiment of FIG. 9.

FIG. 13 is an exploded view of the three pieces of the embodiment of FIG. 9. As shown in FIG. 13, the front surface hard plastic shell 902 is aligned to cover the front portion of the silicone cover 920. The back surface hard plastic cover 904 is aligned to cover the back portion 906 of the silicone cover 922. The silicone hinge 908 connects the front portion 922 to the back portion 906 of the silicone cover 922.

Mechanical connectors 924 illustrate the manner in which the back surface hard plastic cover 904 attaches to the back portion 956 (FIG. 10) of the handheld electronic device. Similarly, front surface hard plastic shell 902 includes similar mechanical connectors (not shown) that connect the front surface hard plastic shell 902 to the front portion 960 (FIG. 10) of the handheld electronic device.

As illustrated in FIG. 13, the silicone cover 922 is a continuous cover that is disposed within the front surface hard plastic cover 902 and the back surface hard plastic cover 904, and extends around the side of the handheld electronic device to provide protection to the front, back and side portions of the handheld electronic device. In this manner, protection is not only provided to the front and back faces, but also at the location where the handheld electronic device 950 hinges, as illustrated in FIG. 10, with a continuous silicone cover.

As disclosed above, the connecting silicone hinge 908 includes pads 916 (FIG. 9) that allow activation of buttons 958 (FIG. 10), while the protective case 900 is in a closed position. In this manner, the silicone cover 922 provides protection to the handheld electronic device and allows activation of buttons in the hinge area of the handheld electronic device. Further, the combination of the hard plastic covers 902, 904 that surround the softer silicone cover 922 provides a substantial amount of protection to the handheld electronic device that is not available from either the use of just a silicone cover or hard plastic covers.

The hard plastic covers 902, 904 protect the handheld electronic device from sharp impacts. The shock of hard impacts is spread along the surface of the hard plastic outer covers 902, 904, and is absorbed by the silicone cover 922. In this manner, the combination of the hard plastic covers 902, 904 and the silicone cover 922 provides both protection and accessibility that has not been available to hinged type of handheld electronic devices, such as flip phones.

Although the embodiment 900 is shown as a handheld electronic device that pivots along a side portion, a silicone hinge can also be provided on a top portion of a protective cover for handheld electronic devices that hinge along a top portion. Further, a silicone hinge can be provided along a bottom portion of the protective cover for handheld electronic devices that hinge along a bottom portion. Of course, the silicone hinge can be employed on either side of the protective cover, depending upon which side the electronic device hinges.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A protective cover for a portable computing device, the portable computing device having a plastic shell that includes at least a first portion and a second portion, the second portion of the plastic shell connected to the first portion of the plastic shell through a hinge such that the second portion of the plastic shell of the portable computing device articulates relative to the first portion, the protective cover comprising:
- a first hardshell component configured to removably attach to the first portion of the plastic shell of the portable computing device by snapping onto the first portion of the portable computing device to cover and protect at least one surface of the first portion of the portable computing device;
- a second hardshell component configured to removably attach to the second portion of the plastic shell of the portable computing device by snapping onto the second portion of the portable computing device to cover and protect at least one surface of the second portion of the portable computing device; and
- a silicone hinge attached to the first hardshell component and the second hardshell component such that the silicone hinge of the protective cover is configured to align with the hinge of the portable computing device when the first and the second hardshell components are snapped onto the first and the second plastic shell portions of the portable computing device, respectively, wherein the silicone hinge of the protective cover flexes to allow second hardshell component to articulate relative to the first hardshell component and enables the second portion of the portable computing device to remain articulable relative to the first portion of the portable computing device when the protective cover is installed on the first and second plastic shell portions of the portable computing device.

2. The protective cover of claim 1 wherein the silicone hinge of the protective cover protects at least a portion of the hinge of the portable computing device when the protective cover is installed on the portable computing device.

3. The protective cover of claim 1 wherein the silicone hinge of the protective cover extends under at least one of the first and the second hardshell components to further protect at least one of the first and the second portions of the plastic shell when the protective cover is installed on the portable computing device.

4. The protective cover of claim 1 wherein at least one of the first hardshell component and the second hardshell component includes an opening providing access to a feature of the portable computing device when the protective cover is installed on the portable computing device.

5. The protective cover of claim 1 wherein the silicone hinge is molded onto the first hardshell component and the second hardshell component.

6. The protective cover of claim 1 wherein the silicone hinge is comolded with at least one of the first hardshell component and the second hardshell component.

7. The protective cover of claim 1 wherein the silicone hinge includes one or more pads for accessing a button of the portable computing device.

8. The protective cover of claim 1 wherein the portable computing device is a smartphone.

9. The protective cover of claim 1 wherein the portable computing device is a laptop computer.

10. The protective cover of claim 1 wherein the portable computing device is a tablet computer.

11. The protective cover of claim 1 wherein the first hardshell component protects at least a second surface of the first portion of the portable computing device when the protective cover is installed on the portable computing device.

12. The protective cover of claim 1 wherein the silicone hinge extends around to a side portion of the portable computing device to protect the side portion when the protective cover is installed on the portable computing device.

13. A case for protecting a portable electronic device, the portable electronic device having a plastic shell comprising a first portion and a second portion that is hingedly attached to the first portion with a hinging portion such that the second portion articulates relative to the first portion, the case comprising:
- a first hardshell member removably attachable to the first portion of the plastic shell of the portable electronic device for protecting the first portion of the portable electronic device;
- a second hardshell member removably attachable to the second portion of the plastic shell of the portable electronic device for protecting the second portion of the portable electronic device, wherein the first hardshell member and the second hardshell member removably snap onto the first portion of the portable electronic device and the second portion of the portable electronic device, respectively; and
- a flexible hinge member permanently affixed to the first hardshell member and permanently affixed to the second hardshell member, wherein the first hardshell member is attached to the second hardshell member through the flexible hinge member, and wherein the flexible hinge member is in proximity to the hinging portion of the portable electronic device when the first and the second hardshell members of the case are attached to the respective first and second shell portions of the portable electronic device, the flexible hinge member permitting articulation of the second portion of the portable electronic device relative to the first portion of the portable electronic device when the case is attached to the portable electronic device due to flexing of a flexible elastomeric material that comprises the flexible hinge member.

14. The case of claim 13 wherein the flexible hinge member of the case protects the hinging portion of the portable electronic device when the case is attached to the portable electronic device.

15. The case of claim 13 wherein the flexible elastomeric material comprises silicone.

16. The case of claim 13 wherein the flexible hinge member extends around a side portion of the portable electronic device to protect the side portion of the portable electronic device when the case is attached to the portable electronic device.

17. The case of claim 13 wherein the flexible hinge member of the case is molded onto the first and the second hardshell members.

18. The case of claim 17 wherein the flexible hinge member of the case is molded onto the first and the second hardshell members using a two shot molding process.

19. A case for protecting a portable electronic device, the portable electronic device having a shell comprising a first portion and a second portion that is hingedly attached to the first portion with a hinging portion such that the second portion articulates relative to the first portion, the case comprising:

a first hardshell member removably attachable to the first portion of the shell of the portable electronic device for protecting the first portion of the portable electronic device;

a second hardshell member removably attachable to the second portion of the shell of the portable electronic device for protecting the second portion of the portable electronic device; and a flexible hinge member permanently affixed to the first hardshell member and permanently affixed to the second hardshell member, wherein the first hardshell member is attached to the second hardshell member through the flexible hinge member, wherein the flexible hinge member is in proximity to the hinging portion of the portable electronic device when the first and the second hardshell members of the case are attached to the respective first and second shell portions of the portable electronic device, the flexible hinge member permitting articulation of the second portion of the portable electronic device relative to the first portion of the portable electronic device when the case is attached to the portable electronic device due to flexing of a flexible elastomeric material that comprises the flexible hinge member, and wherein the flexible elastomeric material that comprises the flexible hinge member extends under at least one of the first hardshell member and the second hardshell member and between the at least one of the hardshell members and a respective one of the first portion and the second portion of the shell of the portable electronic device when the case is attached to the portable electronic device.

* * * * *